United States Patent [19]

Price, Jr.

[11] 4,392,067
[45] Jul. 5, 1983

[54] LOGIC SELECT CIRCUIT

[75] Inventor: John J. Price, Jr., Mesa, Ariz.

[73] Assignee: Motorola, Inc., Schaumburg, Ill.

[21] Appl. No.: 235,397

[22] Filed: Feb. 18, 1981

[51] Int. Cl.³ ........................... H03L 5/00; H03K 5/22
[52] U.S. Cl. ..................................... 307/475; 307/559;
307/360; 307/317 R
[58] Field of Search ............................... 307/360–361,
307/446, 475, 558–561

[56] References Cited

U.S. PATENT DOCUMENTS

| | | | |
|---|---|---|---|
| 3,974,404 | 8/1976 | Davis | 307/475 |
| 4,147,940 | 4/1979 | Beydler et al. | 307/475 |
| 4,220,876 | 9/1980 | Ray | 307/559 X |
| 4,309,693 | 1/1982 | Craven | 307/475 X |

Primary Examiner—Stanley D. Miller
Assistant Examiner—D. R. Bertelson
Attorney, Agent, or Firm—Michael D. Bingham

[57] ABSTRACT

A circuit for use with interface systems for providing a threshold setting function wherein the system can be made to interface with T²L or CMOS logic with either 5 or 15 volt power supply capabilities. The circuit comprises a pair of matched resistors coupled in series to one another. The first one of the resistors is returned to a select terminal via a first pair of diodes. The second resistor is returned to a terminal at which may be supplied a ground reference potential via a second pair of diodes. A source of current is provided that is coupled to the interconnection of the second resistor with the second pair of diodes. A threshold output is provided to the interface system at the interconnection between the serially connected resistors.

5 Claims, 1 Drawing Figure

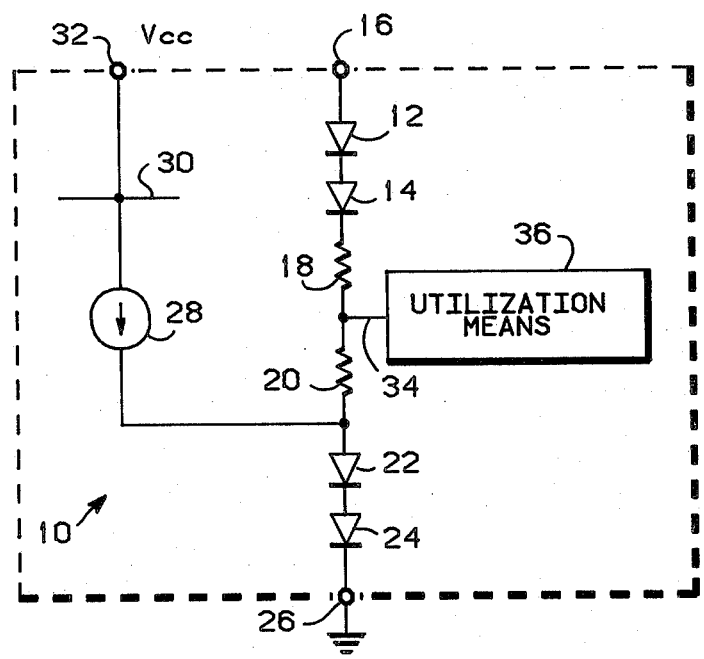

LOGIC SELECT CIRCUIT

BACKGROUND OF THE INVENTION

1. Field of the Invention

This present invention is related to threshold level setting circuits and more particularly to a circuit for use in combination with an interface system to make such system compatible with both T²L and CMOS logic.

2. Description of the Prior Art

Nearly all interface systems require a threshold setting function in order that they be compatible with several different logic signal drive. For example, digital to analog converters (DACs) are a type of interface circuit which in most cases should be capable of accommodating T²L or CMOS logic input signals. In addition to interfacing easily with T²L or CMOS logic, DACs as aforementioned should also be able to operate with either logic using either +5 volt or ±15 volt supplies.

Hence, there is a need for a simple logic select circuit suitable to be manufactured on "chip" with an integrated interface system to provide multiple threshold level for the system without requiring external circuitry in order to make the interface system compatible with several different logic input signals that may be supplied thereto and which can operate from either a 5 volt or 15 volt power supply.

SUMMARY OF THE INVENTION

Accordingly, it is an object of the present invention to provide a logic select circuit for supplying a multi-level logic threshold signal.

Another object of the invention is to provide a circuit for use with an interface system to make the system compatible with several different logic drive signals and different power supply voltages.

In accordance with the foregoing and other objects there is provided a logic select circuit comprising a series combination of a first pair of diodes coupled to a pair of serially connected matched resistors which in turn are coupled to a second pair of diodes. A constant source for providing a predetermined constant current is connected at the interconnection between the serially connected resistors to the second pair of diodes with an output of the circuit being taken at the interconnection between the pair of resistors.

It is a feature of the invention that the select circuit is provided on board of an integrated interface circuit to provide a selectable threshold level function to the interface circuit. The select circuit would be coupled to first and second terminals with the second terminal receiving a ground reference potential. By allowing the first terminal to float, a T²L logic threshold level is obtained and, by connecting the first terminal to a power supply source, a CMOS logic threshold is provided.

DESCRIPTION OF THE DRAWING

The single FIGURE is a schematic diagram of the preferred embodiment of the invention.

DESCRIPTION OF THE EMBODIMENT

Turning to the Figure, there is shown within the dashed outline form logic select circuit 10 which is suitable to be fabricated in monolithic circuit form. Logic select circuit 10 includes a first pair of diode means 12 and 14 coupled between a select terminal 16 and one lead of resistor 18. Resistor 18 is serially connected to resistor 20 which in turn is coupled in series with a second pair of diode means 22 and 24. The resistors 18 and 20 function as circuit means interconnecting the first and second diode pair means. The cathode of diode means 24 is adapted to be connected to a ground reference potential supplied at terminal 26. A constant current source 28 is connected to power supply connector 30 to $V_{CC}$ at terminal 32 and supplies a constant current to diode means pair 22 and 24. The output of logic select circuit 10 is taken at the interconnection between resistors 18 and 20 to set the threshold logic level, via lead 34, to utilization means 36. If, for example, utilization means 36 is a digital to analog converter (DAC) such as a MC-3512 DAC manufactured by Motorola Inc., logic select circuit 10 could be incorporated on the same integrated chip comprising the MC-3512 DAC such that the DAC could be driven by both T²L and CMOS logic input signals as will be explained.

In operation, if utilization means 36 is to be driven by T²L logic signals, the threshold level must be set to approximately 1.4 volts, as understood. By allowing select input terminal 16 to float, assuming that the output via lead 34 is well buffered, diode means 22 and 24 would be rendered conductive by current source 28 providing a minimum current, for example, of 100 μ-amps thereto. Hence a voltage drop of approximately 1.4 volts (0.7 volts across each diode 22 and 24) appears at lead 34 regardless of the magnitude of $V_{CC}$ (within a range between 5 volts to 15 volts). Hence, utilization means 36 could function with T²L logic drive signals.

If select terminal 16 is connected to $V_{CC}$, utilization means 36 functions with CMOS logic signals as the threshold level set via lead 34 is then equal to $V_{CC}/2$. The voltage potential $V_{CC}/2$ is caused to appear by making resistors 18 and 20 equal valued and matching diode means 12, 14, 22 and 24 to each other, neglecting the small current from current source 28, wherein the two symmetrical portions are formed comprising first, diodes 12 and 14 and resistor 18 and secondly, diodes 22 and 24 and resistor 20.

Thus, what has been described is a novel logic select circuit for setting the logic threshold of an interface system coupled thereto wherein the interface system is made compatible to several logic drive input signals, i.e., T²L and CMOS. By selectively floating or connecting a select terminal of the logic select circuit the logic threshold level is set for either T²L or CMOS logic.

I claim:

1. A logic select circuit for providing a multi-level logic threshold signal at an output thereof, comprising:
   first diode means coupled between a first terminal and a first circuit node;
   second diode means coupled between a second terminal at which is supplied a ground reference potential and a second circuit node;
   circuit means coupled between said first and second circuit nodes and to the output of the logic select circuit; and
   current source means coupled to said second circuit node for providing a predetermined current thereto such that a first logic threshold signal of a first level is produced at the output of the logic select circuit and second logic threshold signal of a second level is produced when said first terminal is connected to a source of operating potential supplied to the logic select circuit.

2. The logic select circuit of claim 1 wherein:

said first diode means includes first and second serially connected diodes; and said second diode means includes third and fourth serially connected diodes.

3. The logic select circuit of claim 2 wherein said circuit means includes:

a first resistor; and a second resistor connected in series with said first resistor with the output of the logic select circuit being coupled to the interconnection point between said first and second resistors.

4. A monolithic integrated logic select circuit for providing multiple logic threshold signals to an utilization means, comprising:

first and second circuit means serially connected between a first terminal and a second terminal, said first and second circuit means having substantially identical voltage/current transfer characteristics wherein a first logic threshold signal of a first level is produced at the interconnection between said first and second circuit means when an operating potential is applied at said first terminal, said first logic threshold signal having a magnitude substantially equal to one-half said operating potential, said second terminal receiving a ground reference potential;

current source means for supplying a current of predetermined magnitude to said second circuit means wherein a second logic threshold signal of a second level is produced at the interconnection between said first and second circuit means whenever said first terminal is open-circuited;

output circuit means coupled to the interconnection between said first and second circuit means for supplying said first and second logic threshold signals to the utilization means; and said first circuit means including a first diode, a second diode and a first resistor serially connected between said first terminal and a circuit node, said circuit node being coupled to said output circuit means.

5. The logic select circuit of claim 4 wherein said second circuit means includes a third diode, a fourth diode, said third and fourth diode being serially coupled to said second terminal and a second resistor coupled between said serially coupled third and fourth diodes and said circuit node, said current source means being coupled to said third and fourth serially coupled diodes.

* * * * *